(12) United States Patent
Shin

(10) Patent No.: US 10,224,434 B2
(45) Date of Patent: Mar. 5, 2019

(54) MULTI-CHANNEL THIN FILM TRANSISTOR AND PIXEL INCLUDING THE SAME

(71) Applicant: SAMSUNG DISPLAY CO., LTD., Yongin-si, Gyeonggi-do (KR)

(72) Inventor: Hwangsup Shin, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/804,431

(22) Filed: Nov. 6, 2017

(65) Prior Publication Data

US 2018/0337288 A1 Nov. 22, 2018

(30) Foreign Application Priority Data

May 19, 2017 (KR) .................. 10-2017-0062227

(51) Int. Cl.
| | |
|---|---|
| G09G 3/3233 | (2016.01) |
| H01L 29/786 | (2006.01) |
| H01L 27/12 | (2006.01) |
| H01L 29/423 | (2006.01) |
| G09G 3/20 | (2006.01) |
| G09G 3/3225 | (2016.01) |
| H01L 27/32 | (2006.01) |

(52) U.S. Cl.
CPC ..... *H01L 29/78696* (2013.01); *G09G 3/2007* (2013.01); *G09G 3/3225* (2013.01); *H01L 27/124* (2013.01); *H01L 27/1222* (2013.01); *H01L 27/1255* (2013.01); *H01L 29/42384* (2013.01); *H01L 29/78648* (2013.01); *G09G 2300/0426* (2013.01); *H01L 27/3262* (2013.01)

(58) Field of Classification Search
CPC .................. G09G 3/3233; H01L 29/78696
See application file for complete search history.

(56) References Cited

U.S. PATENT DOCUMENTS

| | | | |
|---|---|---|---|
| 7,531,837 B2 | 5/2009 | Liu | |
| 2012/0175627 A1 | 7/2012 | Sun et al. | |
| 2015/0380567 A1* | 12/2015 | Han | H01L 29/0692 257/365 |

FOREIGN PATENT DOCUMENTS

| | | | |
|---|---|---|---|
| KR | 1020030044567 A | 6/2003 | |
| KR | 1020070043550 A | 4/2007 | |
| KR | 1020070108051 A | 11/2007 | |
| KR | 1020090084642 A | 8/2009 | |

* cited by examiner

*Primary Examiner* — Thomas L Dickey
(74) *Attorney, Agent, or Firm* — Cantor Colburn LLP

(57) ABSTRACT

A multi-channel thin film transistor ("TFT") includes: a gate electrode; a semiconductor including a first channel area, which operates within a first driving range and has a first threshold voltage, and a second channel area which operates within a second driving range smaller than the first driving range and has a second threshold voltage, where an absolute value of the second threshold voltage is greater than an absolute value of the first threshold voltage; a first electrode connected to an end of the semiconductor; and a second electrode connected to another end of the semiconductor.

13 Claims, 13 Drawing Sheets

MULTI-CHANNEL THIN FILM TRANSISTOR AND PIXEL INCLUDING THE SAME

This application claims priority to Korean Patent Application No. 10-2017-0062227, filed on May 19, 2017, in the Korean Intellectual Property Office, and all the benefits accruing therefrom under 35 U.S.C. § 119, the content of which in its entirety is herein incorporated by reference.

BACKGROUND

1. Field

One or more embodiments relate to a multi-channel thin film transistor ("TFT") and a pixel including the multi-channel TFT.

2. Description of the Related Art

A display device displays an image, and in particular, an organic light-emitting diode ("OLED") display device has drawn attention.

The OLED display device is self-emissive and may not include a separate light source, which is typically included in a liquid crystal display ("LCD") device, and thus, the OLED display device may be reduced in size resulting in less thickness and weight. The OLED display device also has highly desired characteristics such as low power consumption, high luminance, and fast response rates.

SUMMARY

One or more embodiments include a semiconductor device having improved driving performance and a high-resolution display device with improved display quality by including the semiconductor device.

According to one or more embodiments, a multi-channel thin film transistor ("TFT") includes: a gate electrode; a semiconductor including a first channel area, which operates within a first driving range and has a first threshold voltage, and a second channel area which operates within a second driving range smaller than the first driving range and has a second threshold voltage, where an absolute value of the second threshold voltage is greater than an absolute value of the first threshold voltage; a first electrode connected to an end of the semiconductor; and a second electrode connected to another end of the semiconductor.

In an embodiment, the first channel area may have a first doping concentration corresponding to the first threshold voltage, and the second channel area may have a second doping concentration corresponding to the second threshold voltage.

In an embodiment, a ratio of a channel width of the second channel area to a channel length of the second channel area may be greater than a ratio of a channel width of the first channel area to a channel length of the first channel area.

In an embodiment, an overlapping area of the first channel area and the gate electrode may be greater than an overlapping area of the second channel area and the gate electrode.

In an embodiment, the channel length of the first channel area may be greater than the channel length of the second channel area.

In an embodiment, an area of a first area of the gate electrode which corresponds to the first channel area may be greater than an area of a second area of the gate electrode, which corresponds to the second channel area.

In an embodiment, the semiconductor may include: a first semiconductor including the first channel area; and a second semiconductor including the second channel area.

In an embodiment, a length of a first area of the first semiconductor which corresponds to the first channel area may be greater than a length of a second area of the second semiconductor, which corresponds to the second channel area.

In an embodiment, an overlap area of the second channel area and the gate electrode may be greater than an overlap area of the first channel area and the gate electrode.

In an embodiment, the channel width of the second channel area may be greater than the channel width of the first channel area.

In an embodiment, the gate electrode may include: a first gate electrode disposed below the semiconductor; and a second gate electrode disposed above the semiconductor. In such an embodiment, the multi-channel TFT may further include: a first insulating layer between the first gate electrode and the semiconductor; and a second insulating layer between the second gate electrode and the semiconductor, where a thickness of the first insulating layer may be greater than a thickness of the second insulating layer.

In an embodiment, a voltage may be applied to the first gate electrode in a first gray level area, and a voltage may be applied to the second gate electrode in a second gray level area greater than the first gray level area.

In an embodiment, the multi-channel TFT may further include an insulating layer between the gate electrode and the semiconductor, where the gate electrode may be disposed above or below the semiconductor.

According to one or more embodiments, a pixel of a display device includes: a first transistor connected to a scanning line and a data line of the display device; a capacitor connected between the first transistor and a power voltage line of the display device; a second transistor connected between the power voltage line and a node to which the first transistor and the capacitor are connected; and an emission device connected to the second transistor, where the second transistor includes: a first sub-transistor which operates within a first driving range and having a first threshold voltage; and a second sub-transistor which operates within a second driving range smaller than the first driving range and having a second threshold voltage, the first sub-transistor and the second sub-transistor are connected to each other in parallel, and an absolute value of the second threshold voltage is greater than an absolute value of the first threshold voltage.

In an embodiment, a first channel area of the first sub-transistor may have a first doping concentration corresponding to the first threshold voltage, and a second channel area of the second sub-transistor may have a second doping concentration corresponding to the second threshold voltage.

In an embodiment, a ratio of a channel width of the second sub-transistor to a channel length of the second sub-transistor may be greater than a ratio of a channel width of the first sub-transistor to a channel length of the first sub-transistor.

In an embodiment, the channel length of the first sub-transistor may be greater than the channel length of the second sub-transistor, or the channel width of the second sub-transistor may be greater than the channel width of the first sub-transistor.

In an embodiment, the first sub-transistor and the second sub-transistor may share the gate electrode, the gate electrode may include a first area corresponding to a channel area of the first sub-transistor and a second area corresponding to a channel area of the second sub-transistor, and an area of the first area may be greater than an area of the second area.

In an embodiment, a length of a semiconductor of the first sub-transistor may be greater than a length of a semiconductor of the second sub-transistor.

In an embodiment, each of the first sub-transistor and the second sub-transistor may include a gate electrode to which a voltage is applied, a thickness of a gate insulating layer of the first sub-transistor may be greater than a thickness of a gate insulating layer of the second sub-transistor, the voltage may be applied to the gate electrode of the first sub-transistor when the pixel displays a gray level in a first gray level area, and the voltage may be applied to the gate electrode of the second sub-transistor when the pixel displays a gray level in a second gray level area greater than the first gray level area.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
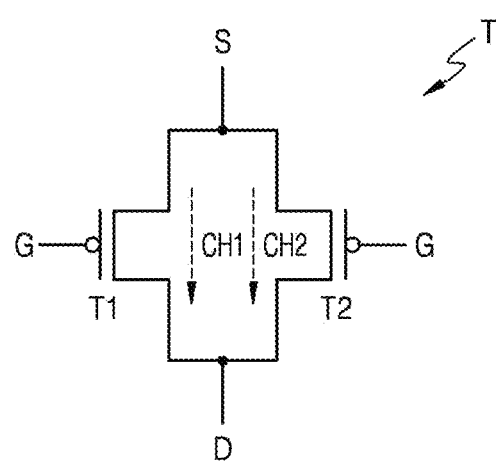
FIG. 1 is a schematic diagram of a multi-channel thin film transistor ("TFT") according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that although the terms "first", "second", etc. may be used herein to describe various components, these components should not be limited by these terms. These components are only used to distinguish one component from another. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a schematic diagram of a multi-channel thin film transistor ("TFT") T according to an embodiment.

Referring to FIG. 1, an embodiment of the multi-channel TFT T is a TFT having two channels and has a structure in which a first sub-transistor T1 and a second sub-transistor T2 are connected to each other in parallel, and each of the first sub-transistor T1 and the second sub-transistor T2 includes a source electrode S, a gate electrode G and a drain electrode D.

In such an embodiment, the source electrode S of the first sub-transistor T1 is connected to that of the second sub-transistor T2, and the drain electrode D of the first sub-transistor T1 is connected to that of the second sub-transistor T2. The gate electrode G of the first sub-transistor T1 may be connected to that of the second sub-transistor T2 or may be disconnected therefrom, and a voltage may be applied to each of the first sub-transistor T1 and the second sub-transistor T2.

A level of a current output from a transistor may be determined based on a gate-source voltage ($V_{GS}$) that is a difference between voltages of a gate electrode and a source electrode. When a source voltage is fixed, a level of the gate-source voltage ($V_{GS}$) may be determined based on a gate voltage. Hereinafter, therefore, a range of the gate-source voltage ($V_{GS}$) or a range of the gate voltage applied to the gate electrode will be referred to as a driving range of the transistor. Generally, as the driving range of the transistor increase, a value of an output current by changing the level of the gate-source voltage ($V_{GS}$) or the gate voltage may be more precisely controlled.

In an embodiment, the first sub-transistor T1 operates within a first driving range and has a first threshold voltage. In such an embodiment, when a voltage that is equal to or greater than the first threshold voltage is applied to the gate electrode G, a current flows through a first channel area CH1 that is a first current path.

In an embodiment, the second sub-transistor T2 operates within a second driving range smaller than the first driving range and has a second threshold voltage. In such an embodiment, when a voltage that is equal to or greater than the second threshold voltage is applied to the gate electrode G, a current flows through a second channel area CH2 that is a second current path. An absolute value of the second threshold voltage is greater than an absolute value of the first threshold voltage.

Since the multi-channel TFT T may provide different current paths, a circuit for achieving two different purposes may be simply designed using the multi-channel TFT T. Accordingly, the number of components of a device including the circuit may be reduced, such that the device may have high integration.

Figure 2A:
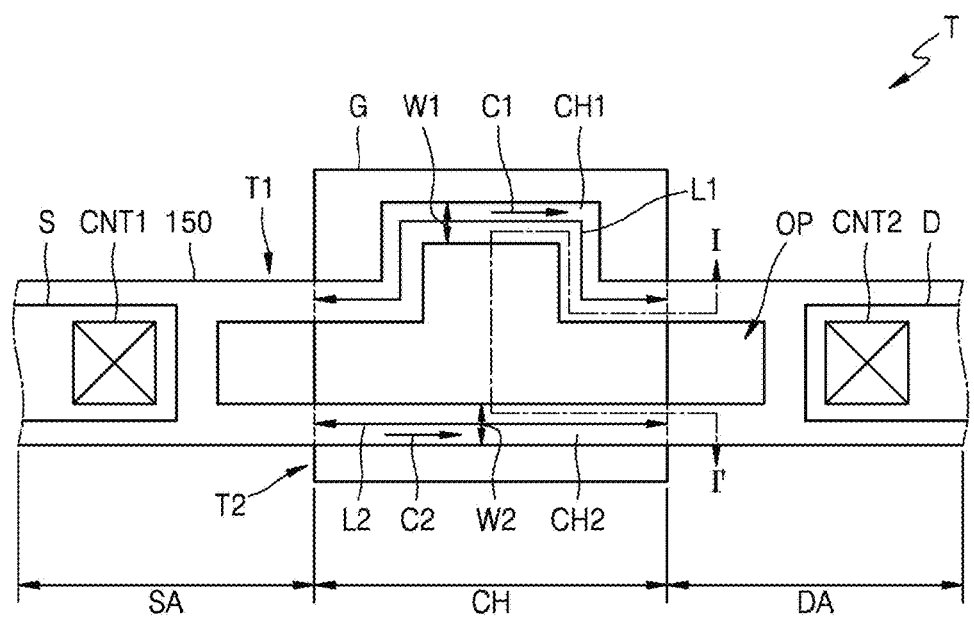
FIGS. 2A to 6B are diagrams illustrating embodiments of the multi-channel TFT according to embodiments.
Figure 2B:
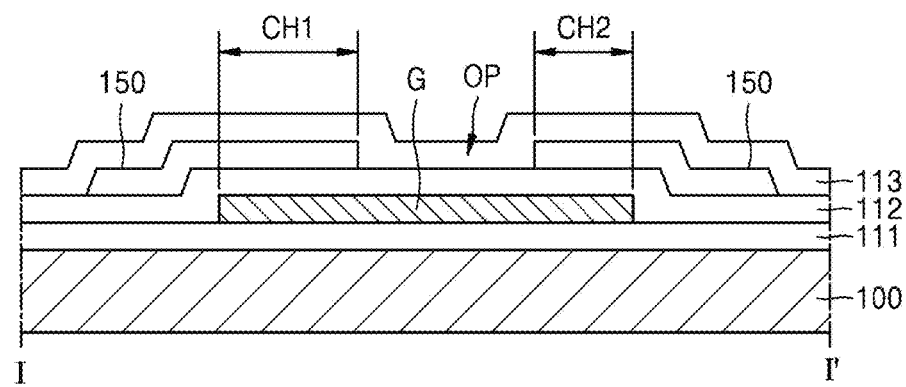
Figure 2C:
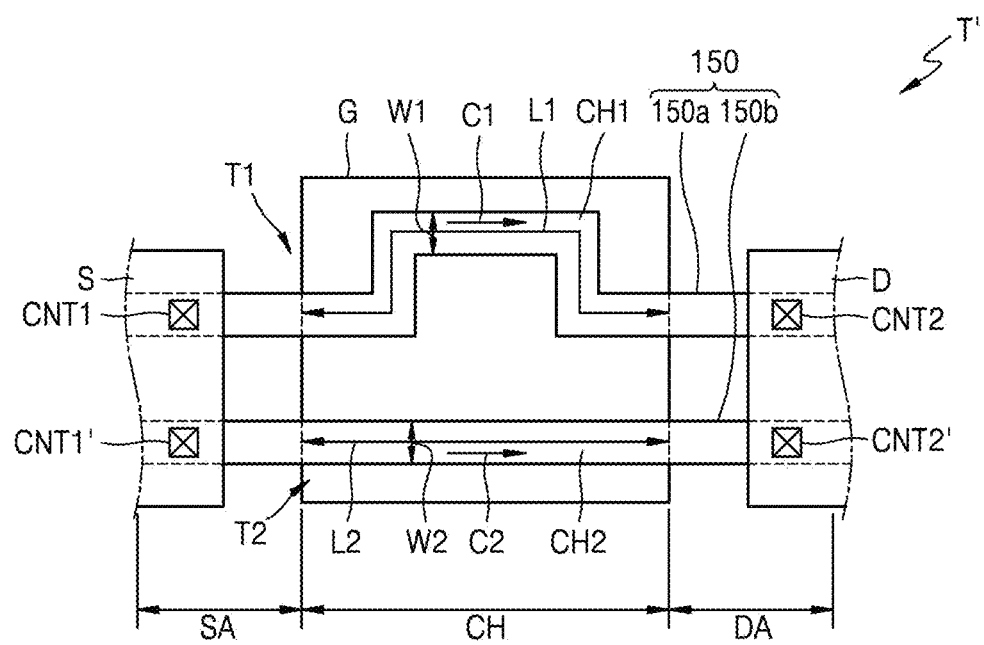

FIGS. 2A to 2C are diagrams illustrating embodiments of the TFT T of FIG. 1, according to an embodiment. FIGS. 2A and 2C are plan views of the TFT T, and FIG. 2B is a cross-sectional view taken along line I-I' of FIG. 2A.

Referring to FIGS. 2A and 2B, an embodiment of the TFT T may include a gate electrode G, a semiconductor 150, a source electrode S, and a drain electrode D.

The TFT T may include the first sub-transistor T1 and the second sub-transistor T2. The first sub-transistor T1 provides a first current C1 through the first channel area CH1 of the semiconductor 150. The second sub-transistor T2 provides a second current C2 through the second channel area CH2. The first sub-transistor T1 and the second sub-transistor T2 may share the gate electrode G, the source electrode S and the drain electrode D, and may be connected to each other in parallel.

The first sub-transistor T1 operates within the first driving range and has the first threshold voltage. The absolute value of the first threshold voltage may be equal to or greater than zero (0). The second sub-transistor T2 operates within the second driving range and has the second threshold value. The second driving range is smaller than the first driving range. The absolute value of the second threshold voltage is greater than the absolute value of the first threshold voltage.

In such an embodiment, when a voltage that is equal to or greater than the first threshold voltage is applied to the gate electrode G of the TFT T, the first sub-transistor T1 is turned on, and a current may flow through the first channel area CH1. In such an embodiment, when a voltage that is equal to or greater than the second threshold voltage is applied to the gate electrode G, both the first sub-transistor T1 and the second sub-transistor T2 are turned on, and currents may flow through the first channel area CH1 and the second channel area CH2. In such an embodiment, an amount of the current flowing through the second channel area CH2 is greater than an amount of the current flowing through the first channel area CH1, and thus the second sub-transistor T2 may function as a main transistor.

Figure 4A:
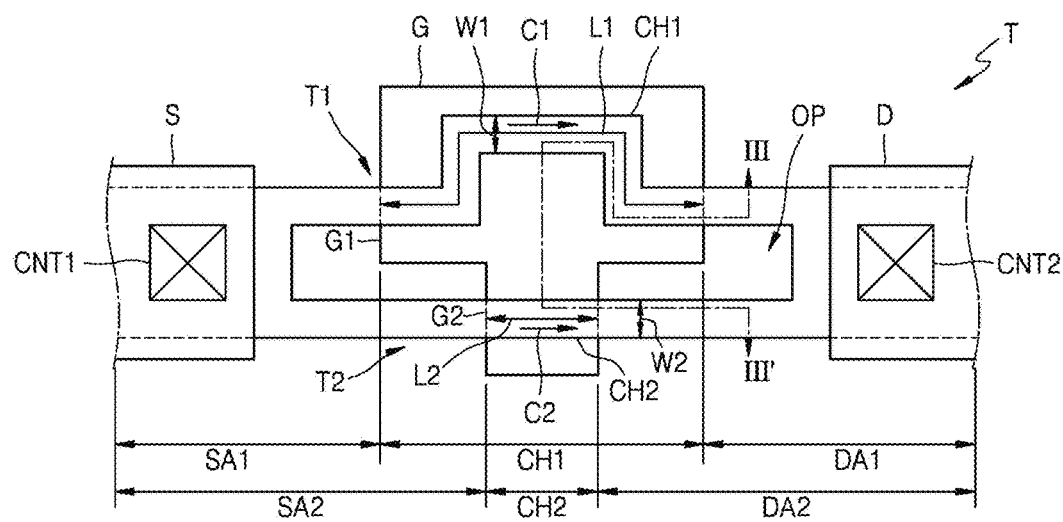
Figure 4B:
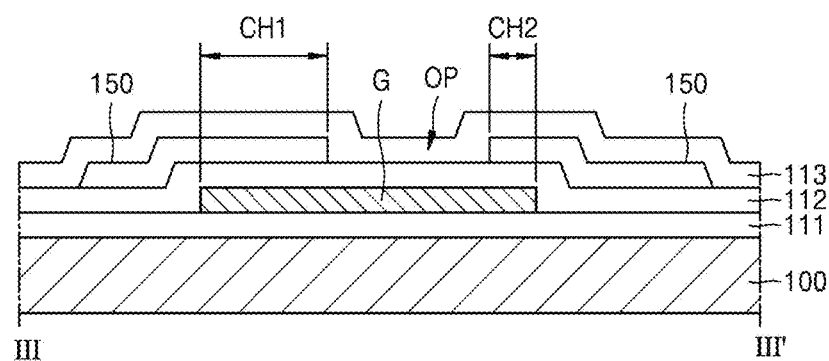

In such an embodiment, as shown in FIG. 4B, a buffer layer 111 may be on the substrate 100, and the gate electrode G may be on the buffer layer 111. A first insulating layer 112 may be on the gate electrode G, and the semiconductor 150 may be on the first insulating layer 112. The semiconductor 150 may include an inorganic semiconductor material such as amorphous silicon or poly crystalline silicon. In an alternative embodiment, the semiconductor 150 may include an organic semiconductor material or an oxide semiconductor material.

The semiconductor 150 includes a source area SA connected to the source electrode S, a drain area DA connected to the drain electrode D, and a channel area CH between the source area SA and the drain area DA. The source area SA and the drain area DA may be doped with impurities, which is determined based on a transistor type (e.g., an N type or a P type). The channel area CH may overlap the gate electrode G.

An opening OP is defined in the semiconductor 150, and the semiconductor 150 may include the first channel area CH1 for forming the first current path and the second channel area CH2 for forming the second current path. In an embodiment, the first channel area CH1 and the second channel area CH2 may be areas defined by dividing an overlapping area of the semiconductor 150 with the gate electrode G. An area of the first channel area CH1 that overlaps the gate electrode G may be greater than an area of the second channel area CH2 that overlaps the gate electrode G.

The first channel area CH1 may have a first channel length L1 and a first channel width W1, and the second channel area CH2 may have a second channel length L2 and a second channel width W2. A ratio (W2/L2) of a channel width to a channel length of the second channel area CH2 may be greater than a ratio (W1/L1) of a channel width to a channel length of the first channel area CH1.

In an embodiment, as shown in FIG. 2A, the first channel area CH1 has a curvature, such that the first channel length L1 may be greater than the second channel length L2 of the second channel area CH2 that has a straight line shape. In an embodiment, where the ratio (W2/L2) of the channel width to the channel length of the second channel area CH2 is greater than the ratio (W1/L1) of the channel width to the channel length of the first channel area CH1, the first channel width W1 may be identical to or different from the second channel width W2. The first channel area CH1 may have a shape such as 'ㄴ', 'ㄹ', 'S', 'M', or 'W'.

In an embodiment, the threshold voltages of the first channel area CH1 and the second channel area CH2 may be adjusted independently of each other by doping. Impurities used to dope the first channel area CH1 and the second channel area CH2 may be the same as or different from impurities used to dope the source area SA and the drain area DA. A doping concentration of the first channel area CH1 may be different from that of the second channel area CH2. The first channel area CH1 may have a first doping concentration to have the first threshold voltage. The second channel area CH2 may have a second doping concentration to have the second threshold voltage. In such an embodiment, the second doping concentration may be higher or lower than the first doping concentration, depending on types of transistors or impurities.

In an embodiment, where the doping concentration of the first channel area CH1 is set to be different from that of the second channel area CH2, different masks may be used to respectively dope the first channel area CH1 and the second channel area CH2.

In an embodiment, as shown in FIG. 2B, a second insulating layer 113 may be on the semiconductor 150, and the source electrode S and the drain electrode D may be on the second insulating layer 113. The source electrode S may be connected to the source area SA of the semiconductor 150 via a contact hole CNT1 defined in the second insulating layer 113. The drain electrode D may be connected to the drain area DA of the semiconductor 150 via a contact hole CNT2 defined in the second insulating layer 113.

In an embodiment, as shown in FIG. 2A, the semiconductor 150 may be integrally formed as a single unitary unit, and the first sub-transistor T1 and the second sub-transistor T2 of the TFT T is defined by portions of the semiconductor 150.

In an alternative embodiment, as shown in FIG. 2C, the semiconductor 150 may be separated into a first semiconductor 150a defining the first sub-transistor T1 and a second semiconductor 150b defining the second sub-transistor T2, which are spaced apart from each other.

In such an embodiment, the source area SA of the first semiconductor 150a and the second semiconductor 150b may be connected to the source electrode S via a contact hole CNT1 and a contact hole CNT1' respectively defined in the second insulating layer 113. The drain area DA of the first semiconductor 150a and the second semiconductor 150b may be connected to the drain electrode D via a contact hole CNT2 and a contact hole CNT2' respectively defined in the second insulating layer 113.

Figure 3A:
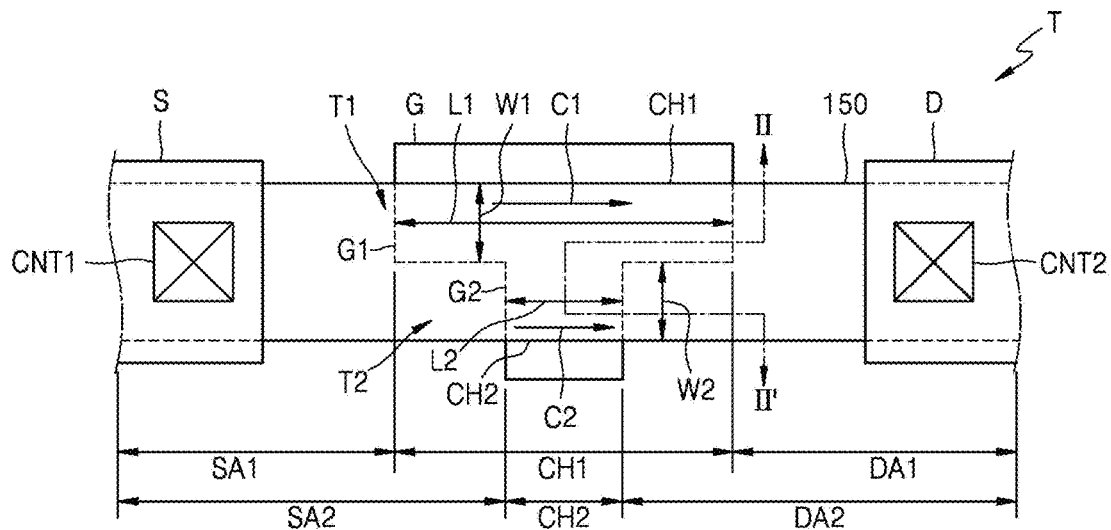
Figure 3B:
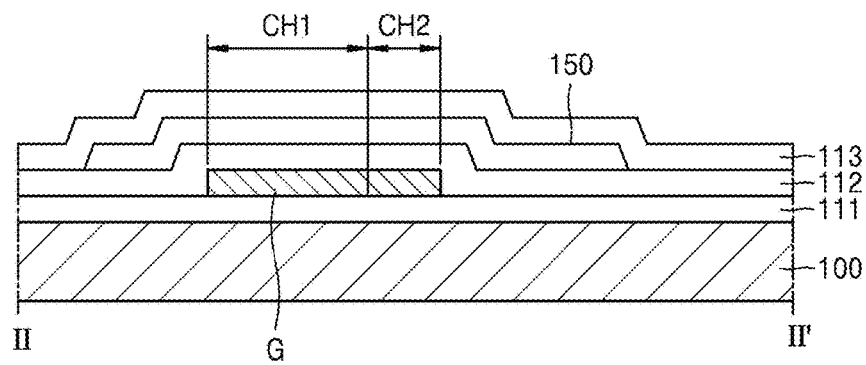

FIGS. 3A and 3B are diagrams illustrating the TFT T according to another alternative embodiment. FIG. 3A is a plan view of the TFT T, and FIG. 3B is a cross-sectional view taken along line II-II' of FIG. 3A.

Referring to FIGS. 3A and 3B, an embodiment of the TFT T may include the gate electrode G, the semiconductor 150, the source electrode S, and the drain electrode D.

The TFT T may include the first sub-transistor T1, in which the first current C1 flows through the first channel area CH1 of the semiconductor 150, and the second sub-transistor T2, in which the second current C2 flows through the second channel area CH2. The first sub-transistor T1 and the second sub-transistor T2 may share the gate electrode G, the source electrode S, and the drain electrode D, and may be connected to each other in parallel.

In such an embodiment, the first sub-transistor T1 operates within the first driving range and has the first threshold value. The absolute value of the first threshold voltage may be equal to or greater than zero (0). The second sub-transistor T2 operates within the second driving range and has the second threshold voltage. The second driving range is smaller than the first driving range. The absolute value of the second threshold voltage is greater than that of the first threshold voltage.

In such an embodiment, when a voltage that is equal to or greater than the first threshold voltage is applied to the gate electrode G of the TFT T, the first sub-transistor T1 is turned on, and a current may flow through the first channel area CH1. In such an embodiment, when a voltage that is equal to or greater than the second threshold voltage is applied to the gate electrode G, both the first sub-transistor T1 and the second sub-transistor T2 are turned on, and currents may flow through the first channel area CH1 and the second channel area CH2. In such an embodiment, the amount of the current flowing through the second channel area CH2 is greater than the amount of the current flowing through the first channel area CH1, and thus the second sub-transistor T2 may function as a main transistor.

In such an embodiment, as shown in FIG. 3B, the buffer layer 111 may be on the substrate 100, and the gate electrode G may be on the buffer layer 111. The gate electrode G may include a first area G1 that partially overlaps the first channel area CH1, and a second area G2 that partially overlaps the second channel area CH2. An area of the first area G1 may be greater than that of the second area G2.

The first insulating layer 112 may be on the gate electrode G, and the semiconductor 150 may be on the first insulating layer 112. The semiconductor 150 may include an inorganic semiconductor material such as amorphous silicon or poly crystalline silicon. Alternatively, the semiconductor 150 may include an organic semiconductor material or an oxide semiconductor material.

In an embodiment, as shown in FIG. 3A, the semiconductor 150 includes a source area SA1 of the first sub-transistor T1, a source area SA2 of the second sub-transistor T2, a drain area DA1 of the first sub-transistor T1, a drain area DA2 of the second sub-transistor T2, the first channel area CH1 between the source area SA1 and the drain area DA1 of the first sub-transistor T1, and the second channel area CH2 between the source area SA2 and the drain area DA2 of the second sub-transistor T2. The source areas SA1 and SA2 are connected to the source electrode S, and the drain areas DA1 and DA2 are connected to the drain electrode D. The source areas SA1 and SA2 and the drain areas DA1 and DA2 may be doped with impurities, which is determined based on a transistor type (e.g., an N type or a P type). The channel area CH may overlap the gate electrode G.

Each of the first channel area CH1 of the first sub-transistor T1 and the second channel area CH2 of the second sub-transistor T2 may overlap the gate electrode G. A size (i.e., a channel length and a channel width) of the first channel area CH1 and a size of the second channel area CH2 may be adjusted based on (e.g., to correspond to) a size and an area of the gate electrode G. An overlapping area of the first channel area CH1 with the gate electrode G (also referred to as a first area G1) may be greater than an overlapping area of the second channel area CH2 with the gate electrode G (also referred to as a second area G2).

The first channel area CH1 has the first channel length L1 and the first channel width W1, and the second channel area CH2 has the second channel length L2 and the second channel width W2. The ratio (W2/L2) of a channel width to a channel length of the second channel area CH2 may be greater than the ratio (W1/L1) of a channel width to a channel length of the first channel area CH1.

In such an embodiment, since an area of the first area G1 is greater than an area of the second area G2, the first channel length L1 is greater than the second channel length L2. In such an embodiment, the first channel width W1 may be identical to or different from the second channel width W2, provided that the ratio (W2/L2) of the channel width to the channel length of the second channel area CH2 is greater than the ratio (W1/L1) of the channel width to the channel length of the first channel area CH1.

In such an embodiment, the threshold voltages of the first channel area CH1 and the second channel area CH2 may be adjusted independently of each other by doping. Impurities used to dope the first channel area CH1 and the second channel area CH2 may be the same as or different from impurities used to dope the source areas SA1 and SA2 and the drain areas DA1 and DA2. The doping concentration of the first channel area CH1 may be different from that of the second channel area CH2. The first channel area CH1 may have the first doping concentration to have the first threshold voltage. The second channel area CH2 may have second doping concentration to have the second threshold voltage. In an embodiment, the second doping concentration may be higher or lower than the first doping concentration, depending on types of transistors or impurities.

In such an embodiment, where the doping concentration of the first channel area CH1 is set to be different from that of the second channel area CH2, different masks may be used to respectively dope the first channel area CH1 and the second channel area CH2.

In an embodiment, as shown in FIG. 3B, the second insulating layer 113 may be on the semiconductor 150, and the source electrode S and the drain electrode D may be on the second insulating layer 113. The source electrode S may be connected to the source areas SA1 and SA2 of the semiconductor 150 via a contact hole CNT1 defined in the second insulating layer 113. The drain electrode D may be connected to the drain areas DA1 and DA2 of the semiconductor 150 via a contact hole CNT2 defined in the second insulating layer 113.

Figure 4C:
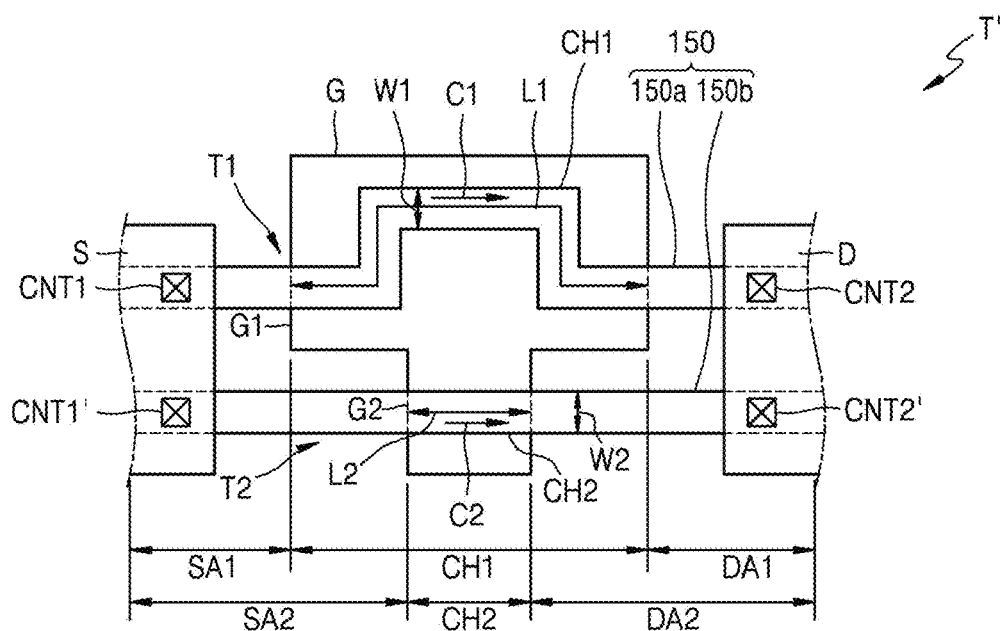

FIGS. 4A to 4C are diagrams illustrating another alternative embodiment of the TFT T. FIGS. 4A and 4C are plan views of embodiments of the TFT T, and FIG. 4B is a cross-sectional view taken along line III-III' of FIG. 4A.

Referring to FIGS. 4A and 4B, an embodiment of the TFT T may include the gate electrode G, the semiconductor 150, the source electrode S, and the drain electrode D.

The TFT T may include the first sub-transistor T1 and the second sub-transistor T2. The first sub-transistor T1 provides a first current C1 through the first channel area CH1 of the semiconductor 150. The second sub-transistor T2 provides a second current C2 through the second channel area CH2. The first sub-transistor T1 and the second sub-transistor T2 may share the gate electrode G, the source electrode S and the drain electrode D, and may be connected to each other in parallel.

The first sub-transistor T1 operates within the first driving range and has the first threshold voltage. The absolute value of the first threshold voltage may be equal to or greater than zero (0). The second sub-transistor T2 operates within the second driving range and has the second threshold voltage. The second driving range may be smaller than the first driving range. The absolute value of the second threshold voltage may be greater than that of the first threshold voltage.

In such an embodiment, when a voltage that is equal to or greater than the first threshold voltage is applied to the gate electrode G of the TFT T, the first sub-transistor T1 is turned on, and a current may flow through the first channel area CH1. In such an embodiment, when a voltage that is equal to or greater than the second threshold voltage is applied to the gate electrode G, both the first sub-transistor T1 and the second sub-transistor T2 are turned on, and currents may flow through the first channel area CH1 and the second channel area CH2. In such an embodiment, the amount of the current flowing through the second channel area CH2 is greater than the amount of the current flowing through the first channel area CH1, and thus the second sub-transistor T2 may function as a main transistor.

In such an embodiment, as shown in FIG. 4B, the buffer layer 111 is on the substrate 100, and the gate electrode G may be on the buffer layer 111. The gate electrode G may include the first area G1 that partially overlaps the first channel area CH1, and the second area G2 that partially overlaps the second channel area CH2. The area of the first area G1 may be greater than that of the second area G2.

The first insulating layer 112 may be on the gate electrode G, and the semiconductor 150 may be on the first insulating layer 112. The semiconductor 150 may include an inorganic semiconductor material such as amorphous silicon or poly crystalline silicon. Alternatively, the semiconductor 150 may include an organic semiconductor material or an oxide semiconductor material.

An opening OP is defined in the semiconductor 150, and the semiconductor 150 may include the first channel area CH1 for forming the first current path and the second channel area CH2 for forming the second current path. In an embodiment, the first channel area CH1 and the second channel area CH2 may be areas defined by dividing an overlapping area of the semiconductor 150 with the gate electrode G. The area of the first channel area CH1 that overlaps the gate electrode G may be greater than an area of the second channel area CH2 that overlaps the gate electrode G. The first channel area CH1 may have curvature, and the second channel area CH2 may have a straight line shape. The first channel area CH1 may have a shape such as 'ㄴ', 'ㄹ', 'n', 'S', 'M', or 'W'.

The semiconductor 150 includes the source area SA1 of the first sub-transistor T1, the source area SA2 of the second sub-transistor T2, the drain area DA1 of the first sub-transistor T1, the drain area DA2 of the second sub-transistor T2, the first channel area CH1 between the source area SA1 and the drain area DA1 of the first sub-transistor T1, and the second channel area CH2 between the source area SA2 and the drain area DA2 of the second sub-transistor T2. The source areas SA1 and SA2 are connected to the source electrode S, and the drain areas DA1 and DA2 are connected to the drain electrode D.

Each of the first channel area CH1 of the first sub-transistor T1 and the second channel area CH2 of the second sub-transistor T2 may overlap the gate electrode G. The overlapping area of the first channel area CH1 and the gate electrode G may be greater than the overlapping area of the second channel area CH2 and the gate electrode G.

The first channel area CH1 may have the first channel length L1 and the first channel width W1, and the second channel area CH2 may have the second channel length L2 and the second channel width W2. The ratio (W2/L2) of the channel width to the channel length of the second channel area CH2 may be greater than the ratio (W1/L1) of the channel width to the channel length of the first channel area CH1.

A size (i.e., a channel length and a channel width) of the first channel area CH1 and a size of the second channel area CH2 may be adjusted based on (e.g., to correspond to) a size and an area of the gate electrode G and a shape of a channel area.

Since an area of the first area G1 of the gate electrode G that overlaps the first channel area CH1 is greater than an area of the second area G2 of the gate electrode G that overlaps the second channel area CH2, and since the first channel area CH1 has curvature, the first channel length L1 may be greater than the second channel length L2. In such an embodiment, the first channel width W1 may be identical to or different from the second channel width W2, provided that the ratio W/L of the channel width to the channel length of the second channel area CH2 is greater than the ratio W/L of the channel width to the channel length of the first channel area CH1.

In such an embodiment, the threshold voltages of the first channel area CH1 and the second channel area CH2 may be adjusted independently of each other by doping. Impurities used to dope the first channel area CH1 and the second channel area CH2 may be the same as or different from impurities used to dope the source areas SA1 and SA2 and the drain areas DA1 and DA2. The doping concentration of the first channel area CH1 may be different from that of the second channel area CH2. The first channel area CH1 may have the first doping concentration to have the first threshold voltage. The second channel area CH2 may have the second doping concentration to have the second threshold voltage. In one embodiment, for example, the second doping concentration may be higher or lower than the first doping concentration, depending on types of transistors or impurities.

Since the doping concentration of the first channel area CH1 is set to be different from that of the second channel area CH2, different masks may be used to respectively dope the first channel area CH1 and the second channel area CH2.

The second insulating layer 113 may be on the semiconductor 150, and the source electrode S and the drain electrode D may be on the second insulating layer 113. The source electrode S may be connected to the source areas SA1 and SA2 of the semiconductor 150 via the contact hole CNT1 formed in the second insulating layer 113. The drain electrode D may be connected to the drain areas DA1 and DA2 of the semiconductor 150 via the contact hole CNT2 formed in the second insulating layer 113.

In an embodiment, as shown in FIG. 4A, the semiconductor 150 may be integrally formed as a single unitary unit, and the first sub-transistor T1 and the second sub-transistor T2 of the TFT T is defined by portions of the semiconductor 150.

In an alternative embodiment, as shown in FIG. 4C, the semiconductor 150 may be separated into the first semiconductor 150a defining the first sub-transistor T1 and the second semiconductor 150b defining the second sub-transistor T2, which are spaced apart from each other.

In such an embodiment, the source areas SA1 and SA2 of the first semiconductor 150a and the second semiconductor 150b may be connected to the source electrode S via contact holes CNT1 and CNT1' respectively defined in the second insulating layer 113. The drain areas DA of the first semiconductor 150a and the second semiconductor 150b may be connected to the drain electrode D via contact holes CNT2 and CNT2' respectively defined in the second insulating layer 113.

Figure 5A:
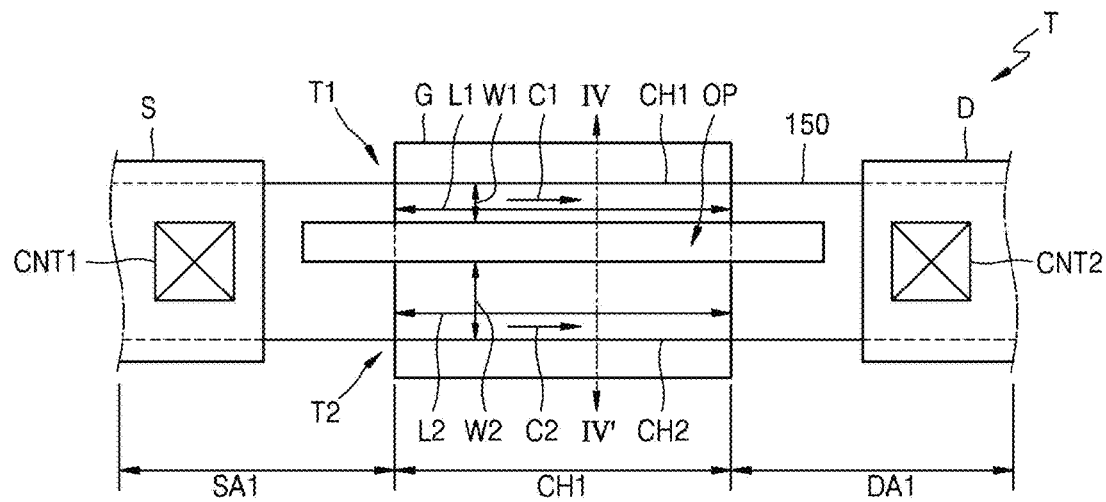
Figure 5B:
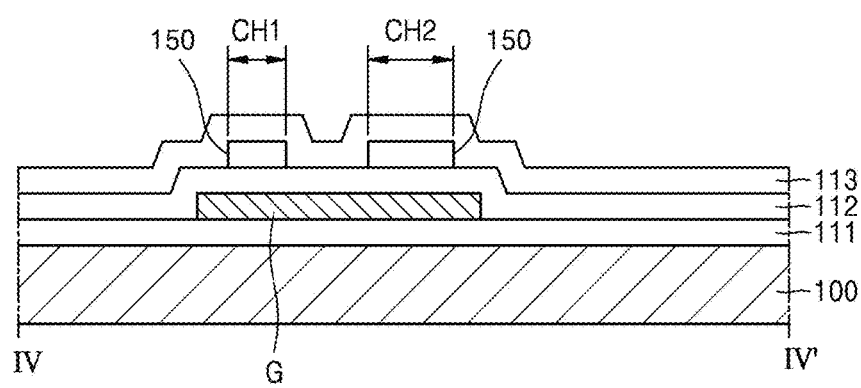
Figure 5C:
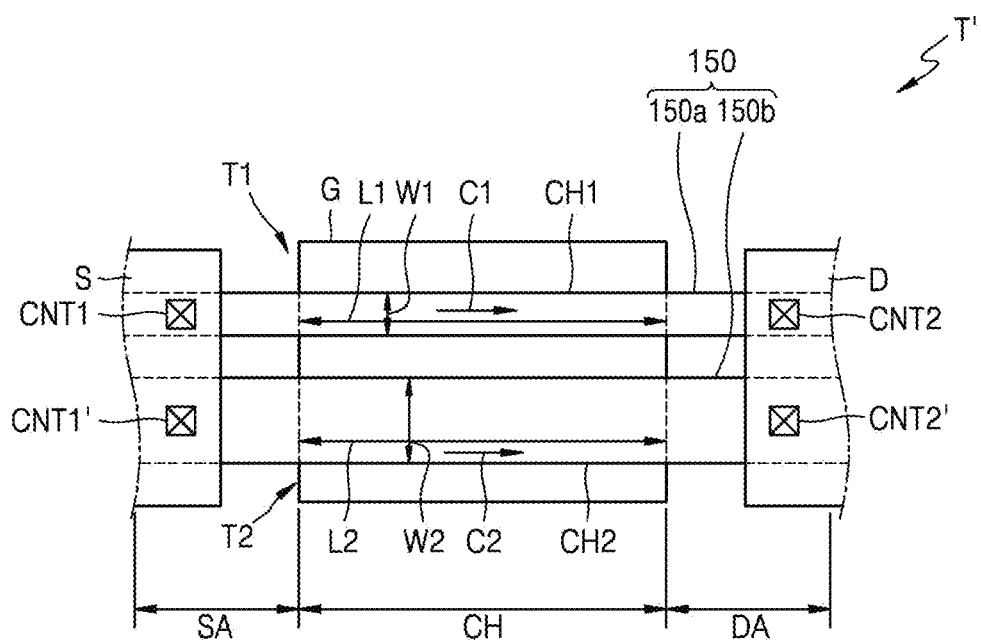

FIGS. 5A to 5C are diagrams illustrating embodiments of the TFT T of FIG. 1, according to another alternative embodiment. FIGS. 5A and 5C are plan views of the TFT T, and FIG. 5B is a cross-sectional view taken along line IV-IV' of FIG. 5A.

Referring to FIGS. 5A and 5B, an embodiment of the TFT T may include the gate electrode G, the semiconductor 150, the source electrode S, and the drain electrode D.

The TFT T may include the first sub-transistor T1 and the second sub-transistor T2. The first sub-transistor T1 provides the first current C1 through the first channel area CH1 of the semiconductor 150. The second sub-transistor T2 provides the second current C2 through the second channel area CH2. The first sub-transistor T1 and the second sub-transistor T2 may share the gate electrode G, the source electrode S and the drain electrode D, and may be connected to each other in parallel.

The first sub-transistor T1 operates within the first driving range and has the first threshold voltage. The absolute value of the first threshold voltage may be equal to or greater than zero (0). The second sub-transistor T2 operates within the second driving range and has the second threshold value. The second driving range is smaller than the first driving range. The absolute value of the second threshold voltage is greater than that of the first threshold voltage.

In such an embodiment, when a voltage that is equal to or greater than the first threshold voltage is applied to the gate electrode G of the TFT T, the first sub-transistor T1 is turned on, and a current may flow through the first channel area CH1. In such an embodiment, when a voltage that is equal to or greater than the second threshold voltage is applied to the gate electrode G, both the first sub-transistor T1 and the second sub-transistor T2 are turned on, and currents may flow through the first channel area CH1 and the second channel area CH2. In such an embodiment, since an amount of the current flowing through the second channel area CH2 is greater than an amount of the current flowing through the first channel area CH1, the second sub-transistor T2 may function as a main transistor.

In such an embodiment, as shown in FIG. 5B, the buffer layer 111 is on the substrate 100, and the gate electrode G may be on the buffer layer 111. The first insulating layer 112 may be on the gate electrode G, and the semiconductor 150 may be on the first insulating layer 112. The semiconductor 150 may include an inorganic semiconductor material such as amorphous silicon or poly crystalline silicon. Alternatively, the semiconductor 150 may include an organic semiconductor material or an oxide semiconductor material.

The semiconductor 150 includes the source area SA connected to the source electrode S, the drain area DA connected to the drain electrode D, and the channel area CH between the source area SA and the drain area DA. The channel area CH may overlap the gate electrode G.

An opening OP is defined in the semiconductor 150, and the semiconductor 150 may include the first channel area CH1 for forming the first current path and the second channel area CH2 for forming the second current path. In an embodiment, the first channel area CH1 and the second channel area CH2 may be areas defined by dividing an overlapping area of the semiconductor 150 with the gate electrode G. The area of the first channel area CH1 that overlaps the gate electrode G may be smaller than the area of the second channel area CH2 that overlaps the gate electrode G.

The first channel area CH1 may have the first channel length L1 and the first channel width W1, and the second channel area CH2 may have the second channel length L2 and the second channel width W2. The ratio (W2/L2) of the channel width to the channel length of the second channel area CH2 may be greater than the ratio (W1/L1) of the channel width to a channel length of the first channel area CH1.

In such an embodiment, the first channel length L1 of the first channel area CH1 is identical to the second channel length L2 of the second channel area CH2, and the first channel width W1 of the first channel area CH1 is smaller than the second channel width W2 of the second channel area CH2.

In such an embodiment, the threshold voltages of the first channel area CH1 and the second channel area CH2 may be adjusted independently of each other by doping. Impurities used to dope the first channel area CH1 and the second channel area CH2 may be the same as or different from impurities used to dope the source area SA and the drain area DA. The doping concentration of the first channel area CH1 may be different from that of the second channel area CH2. The first channel area CH1 may have the first doping concentration to have the first threshold voltage. The second channel area CH2 may have the second doping concentration to have the second threshold voltage. In one embodiment, for example, the second doping concentration may be higher or lower than the first doping concentration, depending on types of transistors or impurities.

In such an embodiment, since the doping concentration of the first channel area CH1 is set to be different from that of the second channel area CH2, different masks may be used to respectively dope the first channel area CH1 and the second channel area CH2.

The second insulating layer 113 may be on the semiconductor 150, and the source electrode S and the drain electrode D may be on the second insulating layer 113. The source electrode S may be connected to the source area SA of the semiconductor 150 via a contact hole CNT1 defined in the second insulating layer 113. The drain electrode D may be connected to the drain area DA of the semiconductor 150 via a contact hole CNT2 defined in the second insulating layer 113.

In an embodiment, as shown in FIG. 5A, the semiconductor 150 may be integrally formed as a single unitary unit, and the first sub-transistor T1 and the second sub-transistor T2 of the TFT T is defined by portions of the semiconductor 150.

In an alternative embodiment, as shown in FIG. 5C, the semiconductor 150 may be separated into the first semiconductor 150a defining the first sub-transistor T1 and the second semiconductor 150b defining the second sub-transistor T2, which are spaced apart from each other.

In such an embodiment, the source area SA of the first semiconductor 150a and the second semiconductor 150b may be connected to the source electrode S via contact holes CNT1 and CNT1' respectively defined in the second insulating layer 113. The drain area DA of the first semiconductor 150a and the second semiconductor 150b may be connected to the drain electrode D via contact holes CNT2 and CNT2' respectively defined in the second insulating layer 113.

Figure 6A:
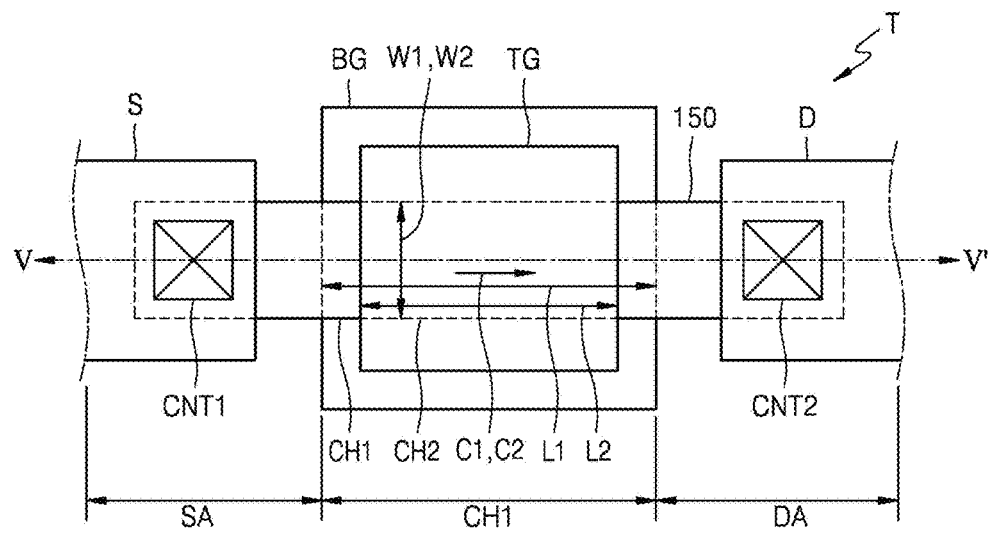
Figure 6B:
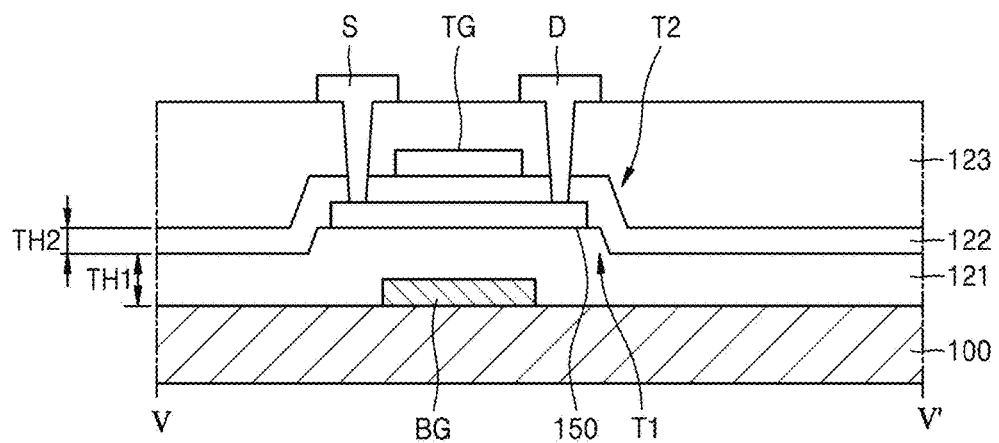

FIGS. 6A and 6B are diagrams illustrating the TFT T, according to another alternative embodiment. FIG. 6A is a plan view of the TFT T, and FIG. 6B is a cross-sectional view taken along line V-V of FIG. 6A.

Referring to FIGS. 6A and 6B, an embodiment of the TFT T may include a bottom gate electrode BG, a top gate electrode TG, the semiconductor 150, the source electrode S, and the drain electrode D.

The TFT T may include the first sub-transistor T1, in which the first current C1 flows through the first channel area CH1 of the semiconductor 150, and the second sub-transistor T2, in which the second current C2 flows through the second channel area CH2. The first sub-transistor T1 and the second sub-transistor T2 may share the semiconductor 150, the source electrode S, and the drain electrode D and may be connected to each other in parallel in a vertical direction. The first sub-transistor T1 and the second sub-transistor T2 may respective include gate electrodes that are independently controlled.

The first sub-transistor T1 may include the bottom gate electrode BG, the semiconductor 150, the source electrode S, and the drain electrode D. The first sub-transistor T1 operates within the first driving range and has the first threshold value. The absolute value of the first threshold voltage may be equal to or greater than zero (0).

The second sub-transistor T2 may include the top gate electrode TG, the semiconductor 150, the source electrode S, and the drain electrode D. The second sub-transistor T2 operates within the second driving range and has the second threshold voltage. The second driving range is smaller than the first driving range. The absolute value of the second threshold voltage is greater than that of the first threshold voltage.

In such an embodiment, when a voltage that is equal to or greater than the first threshold voltage is applied to the bottom gate electrode BG, the first sub-transistor T1 is turned on, and a current may flow through the first channel area CH1. When the voltage that is equal to or greater than the first threshold voltage is applied to the bottom gate electrode BG, the voltage may not be applied to the top gate electrode TG, such that the second sub-transistor T2 may be turned off.

In such an embodiment, when a voltage that is equal to or greater than the second threshold voltage is applied to the top gate electrode TG, the second sub-transistor T2 is turned on, and a current may flow through the second channel area CH2. When the voltage that is equal to or greater than the second threshold voltage is applied to the top gate electrode TG, the voltage may not be applied to the bottom gate electrode BG, such that the first sub-transistor T1 may be turned off.

In such an embodiment, as shown in FIG. 6B, the bottom gate electrode BG may be on the substrate 100, and a first insulating layer 121 may be on the bottom gate electrode BG. A buffer layer may be between the substrate 100 and the bottom gate electrode BG. The first insulating layer 121 may function as a first gate insulating layer and may have a first thickness TH1.

The semiconductor 150 may be on the first insulating layer 121. The semiconductor 150 may include an inorganic semiconductor material such as amorphous silicon or poly crystalline silicon. Alternatively, the semiconductor 150 may include an organic semiconductor material or an oxide semiconductor material.

A second insulating layer 122 may be on the semiconductor 150, and the top gate electrode TG may be on the second insulating layer 122. The second insulating layer 122 may function as a second gate insulating layer and may have a second thickness TH2. The second thickness TH2 may be smaller than the first thickness TH1.

The semiconductor 150 includes the source area SA connected to the source electrode S, the drain area DA connected to the drain electrode D, and the channel area CH between the source area SA and the drain area DA. The source area SA and the drain area DA may be doped with impurities, depending on a transistor type (e.g., an N type or a P type). The channel area CH may overlap the top gate electrode TG and the bottom gate electrode BG.

A size of the top gate electrode TG may be the same as or different from that of the bottom gate electrode BG. In one embodiment, for example, the bottom gate electrode BG may be greater than the top gate electrode TG. When a voltage is applied to the bottom gate electrode BG, the semiconductor 150 may operate with respect to the first channel area CH1 that is the first current path, and when a voltage is applied to the top gate electrode TG, the semiconductor 150 may operate with respect to the second channel area CH2.

The threshold voltages of the first sub-transistor T1 and the second sub-transistor T2 may be adjusted by adjusting thicknesses of the gate insulating layer (i.e., the first insulating layer 121) of the first sub-transistor T1 and the gate insulating layer (i.e., the second insulating layer 122) of the second sub-transistor T2. Since the thickness of the first insulating layer 121 (the first thickness TH1) is greater than the thickness of the second insulating layer 122 (i.e., the second thickness TH2), an absolute value of the threshold voltage of the first sub-transistor T1 may be smaller than that of the threshold voltage of the second sub-transistor T2.

A third insulating layer 123 may be on the top gate electrode TG, and the source electrode S and the drain electrode D may be on the third insulating layer 123. The source electrode S may be connected to the source area SA of the semiconductor 150 via a contact hole CNT1 defined in the second insulating layer 122 and the third insulating layer 123. The drain electrode D may be connected to the drain area DA of the semiconductor 150 via a contact hole CNT2 defined in the second insulating layer 122 and the third insulating layer 123.

Figure 7:
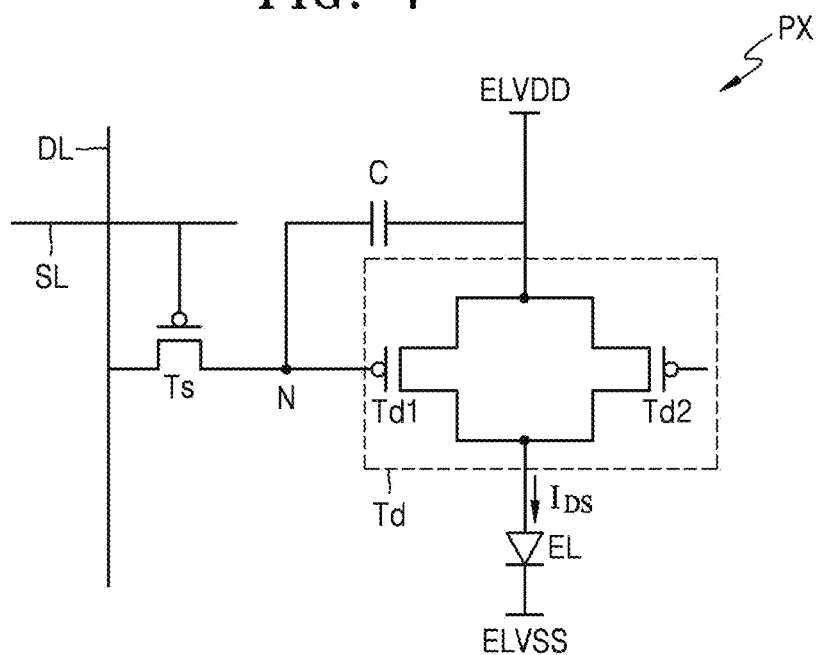
FIG. 7 is a circuit diagram of a pixel of an embodiment of an organic light-emitting display device including the multi-channel TFT of FIG. 1.

FIG. 7 is a circuit diagram of a pixel PX of an embodiment of an organic light-emitting diode ("OLED") display device including the TFT T of FIG. 1.

An embodiment of the organic light-emitting display device may include a display including pixels PX arranged therein for displaying an image, and a driver for transmitting a control signal to each pixel PX. The control signal may include a scanning signal, a data signal, a power voltage, and the like.

The pixel PX may include a switching transistor Ts, a driving transistor Td, a capacitor C, and an emission device EL.

The switching transistor Ts may include a gate electrode connected to a scanning line SL, a first electrode (a source electrode) connected to a data line DL, and a second electrode (a drain electrode) connected to a node N.

The capacitor C may include one electrode connected to the node N, and the other electrode connected to a power voltage line via which a first power voltage ELVDD is applied.

The driving transistor Td may be connected between the node N and the power voltage line, and may be connected to the emission device EL. The driving transistor Td may be a multi-channel TFT T illustrated in FIG. 1. The driving transistor Td may have a structure in which a first driving transistor Td1 (corresponding to the first sub-transistor T1 of FIG. 1) is connected to a second driving transistor Td2 (corresponding to the second sub-transistor T2) in parallel. The driving transistor Td of FIG. 7 is substantially the same as an embodiment of the multi-channel TFT T described above with reference to FIGS. 1 to 6B, and any repetitive detailed description thereof will hereinafter be omitted or simplified.

The first driving transistor Td1 operates within a first driving range and has a first threshold voltage. An absolute value of the first threshold voltage may be equal to or greater than zero (0). The second driving transistor Td2 operates within a second driving range and has a second threshold voltage. The second driving range may be smaller than the first driving range. An absolute value of the second threshold voltage may be greater than that of the first threshold voltage.

The first driving transistor Td1 and the second driving transistor Td2 may each include a gate electrode, a first electrode connected to the power voltage line, and a second electrode connected to the emission device EL. The gate electrodes of the first driving transistor Td1 and the second driving transistor Td2 may be connected to the node N, respectively. In such an embodiment, the first driving transistor Td1 and the second driving transistor Td2 may share a same gate electrode. The first driving transistor Td1 and the second driving transistor Td2 may respectively include gate electrodes. In this case, a gate electrode of one of the first driving transistor Td1 and the second driving transistor Td2 may be connected to the node N, and the other thereof may be connected to a separate control line.

In an embodiment, as illustrated in FIGS. 2A to 5C, the first driving transistor Td1 and the second driving transistor Td2 may be in the same layer as each other, and may be connected to each other in parallel in a horizontal direction.

Channel areas of the first driving transistor Td1 and the second driving transistor Td2 may be doped with impurities to adjust the threshold voltages of the first driving transistor Td1 and the second driving transistor Td2. The channel area of the first driving transistor Td1 is doped at first doping concentration, and the channel area of the second driving transistor Td2 is doped at second doping concentration. The first doping concentration and the second doping concentration may be set in a way such that the absolute value of the second threshold voltage is greater than that of the first threshold voltage.

In such an embodiment, ratios of channel length to channel width of the first driving transistor Td1 and the second driving transistor Td2 may be adjusted to adjust the driving ranges of the first driving transistor Td1 and the second driving transistor Td2. The ratio of the channel length to the channel width of the first driving transistor Td1 may be greater than the ratio of the channel length to the channel width of the second driving transistor Td2 in a way such that the driving range of the second driving transistor Td2 is greater than that of the first driving transistor Td1.

In one embodiment, for example, the channel length of the channel area of the first driving transistor Td1 may be greater than the channel length of the channel area of the second driving transistor Td2. In an alternative embodiment, the channel width of the channel area of the first driving transistor Td1 may be smaller than the channel width of the channel area of the second driving transistor Td2. In another alternative embodiment, an area of the gate electrode which corresponds to the channel area of the first driving transistor Td1 may be greater than an area of the gate electrode which corresponds to the channel area of the second driving transistor Td2. In another alternative embodiment, a length of the semiconductor of the first driving transistor Td1 may be greater than a length of the semiconductor of the second driving transistor Td2.

In an embodiment of the disclosure, when a pixel displays a gray level in a first gray level area (e.g., a low gray level area), the first driving transistor Td1 having the threshold voltage of a small absolute value may be turned on, and the second driving transistor Td2 may be turned off. In such an embodiment, when the pixel displays a gray level in a second gray level area (e.g., a high gray level area) greater than the first gray level area, both the first driving transistor Td1 and the second driving transistor Td2 may be turned on.

In another embodiment, as illustrated in FIGS. 6A and 6B, the first driving transistor Td1 and the second driving transistor Td2 may be in different layers from each other, and may be connected to each other in parallel in a vertical direction.

In such an embodiment, thicknesses of gate insulating layers may be adjusted to adjust the threshold voltages and the driving ranges of the first driving transistor Td1 and the second driving transistor Td2. Since a thickness of the gate insulating layer of the first driving transistor Td1 is set to be greater than a thickness of the gate insulating layer of the second driving transistor Td2, the absolute value of the threshold voltage of the first driving transistor Td1 is smaller than the absolute value of the threshold voltage of the second driving transistor Td2, and the driving range of the first driving transistor Td1 may be greater than the driving range of the second driving transistor Td2.

In an embodiment of the disclosure, when a pixel displays a gray level in the first gray level area (e.g., the low gray level area), a voltage is applied to a bottom gate electrode to turn on the first driving transistor Td1 and turn off the second driving transistor Td2. In such an embodiment, when the pixel displays a gray level in the gray level gray level area (e.g., the high gray level area) greater than the first gray level area, a voltage is applied to a top gate electrode to turn off the first driving transistor Td1 and turn on the second driving transistor Td2.

The emission device EL may include an electrode connected to the driving transistor Td and the other electrode connected to a power supply for applying a second power voltage ELVSS. The second power voltage ELVSS may be smaller than the first power voltage ELVDD. The emission device EL may be an OLED. The emission device EL may emit light due to a driving current $I_{DS}$ output from the driving transistor Td.

FIG. 7 illustrates an embodiment where the pixel PX includes two transistors and one capacitor. However, the disclosure is not limited thereto. In an alternative embodiment, the pixel PX may include at least one transistor and at least one capacitor.

Figure 8:
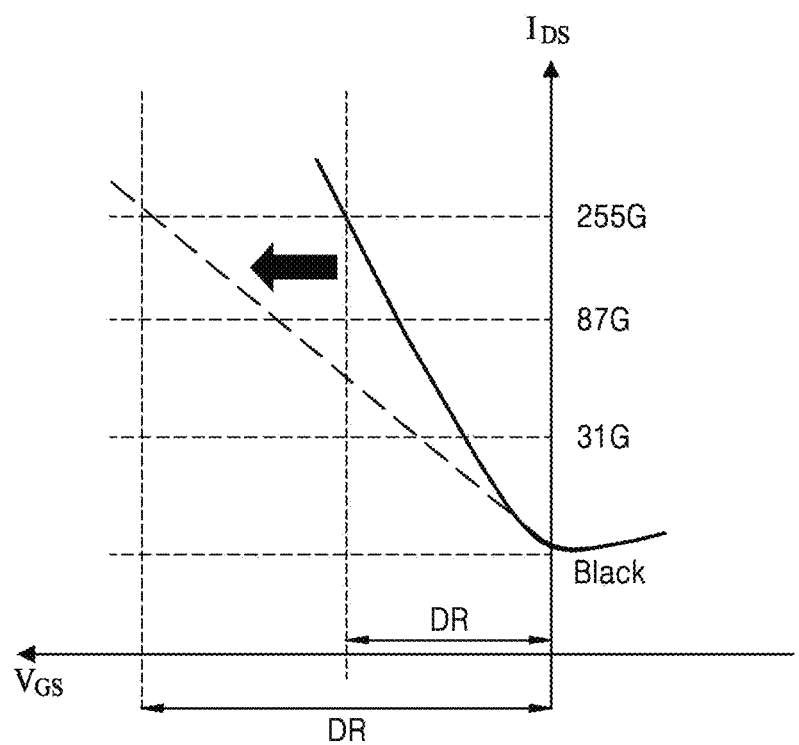
FIG. 8 is a voltage-current graph for explaining an operation of a driving transistor.

FIG. 8 is a voltage-current graph for explaining an operation of a driving transistor.

In a case of a driving transistor having a single channel, a driving current $I_{DS}$ for expressing a certain gray level (e.g., a gray level between 0 and 255) may be determined by a gate-source voltage $V_{GS}$ that is a voltage difference between a gate electrode and a source electrode. When the emission device EL emits light and the light is expressed in black and white according to the driving current $I_{DS}$ flowing in the emission device EL, a magnitude of the gate-source voltage $V_{GS}$ changes due to an increase in a driving range DR of the driving transistor (for example, a graph indicated by a solid line is moved to a graph indicated by a dashed line), and thus a gray level of light emitted from the emission device EL may be precisely controlled. However, the change of the level of the gate-source voltage increases power consumption and may be limited due to a limitation on an output from a driver integrated circuit ("IC") that is a voltage source.

A driving transistor including an embodiment of a multi-channel TFT may have a great driving range in a low gray level, and a driving range of a gate-source voltage $V_{GS}$ for expressing the entire gray level (a gray level between 0 and 255) does not increase.

Figure 9:
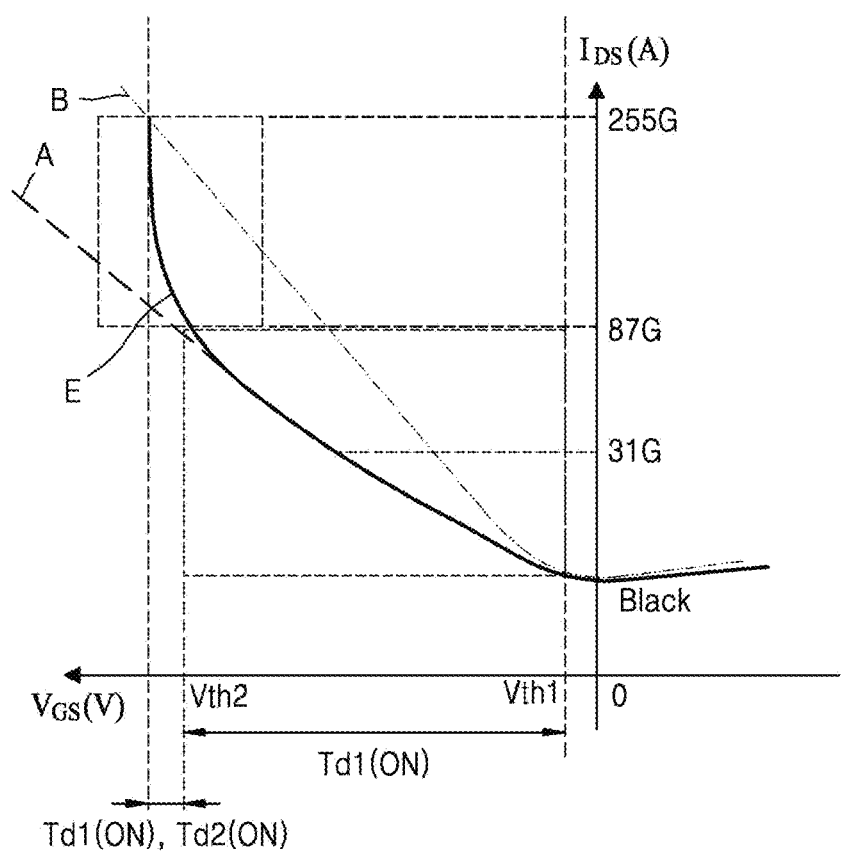
FIGS. 9 to 11 are voltage-current graphs for explaining an operation of an embodiment of a multi-channel TFT as a driving transistor.
Figure 10:
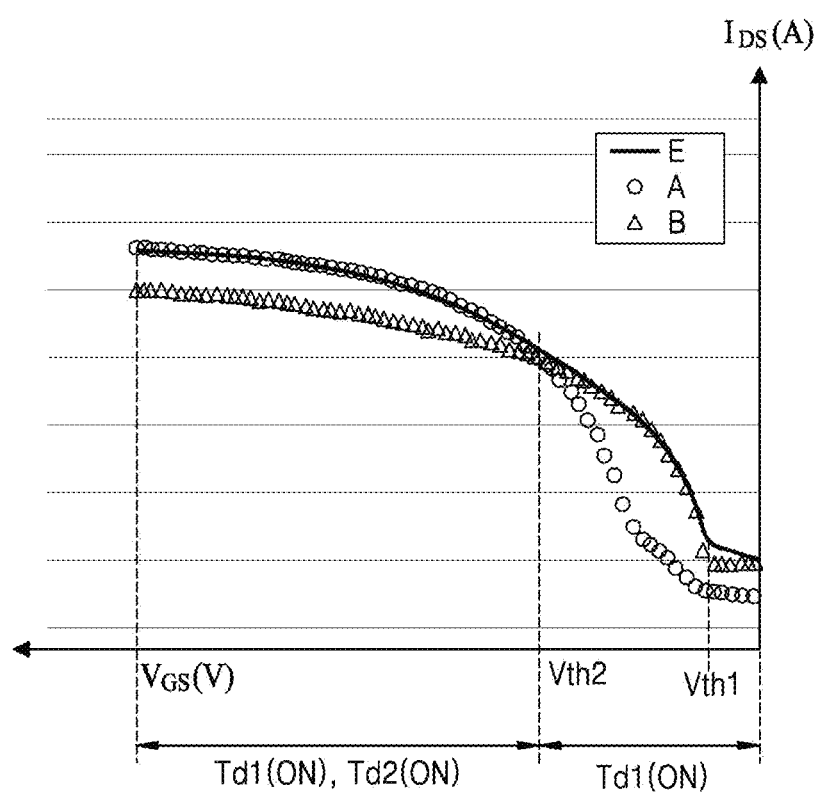
Figure 11:
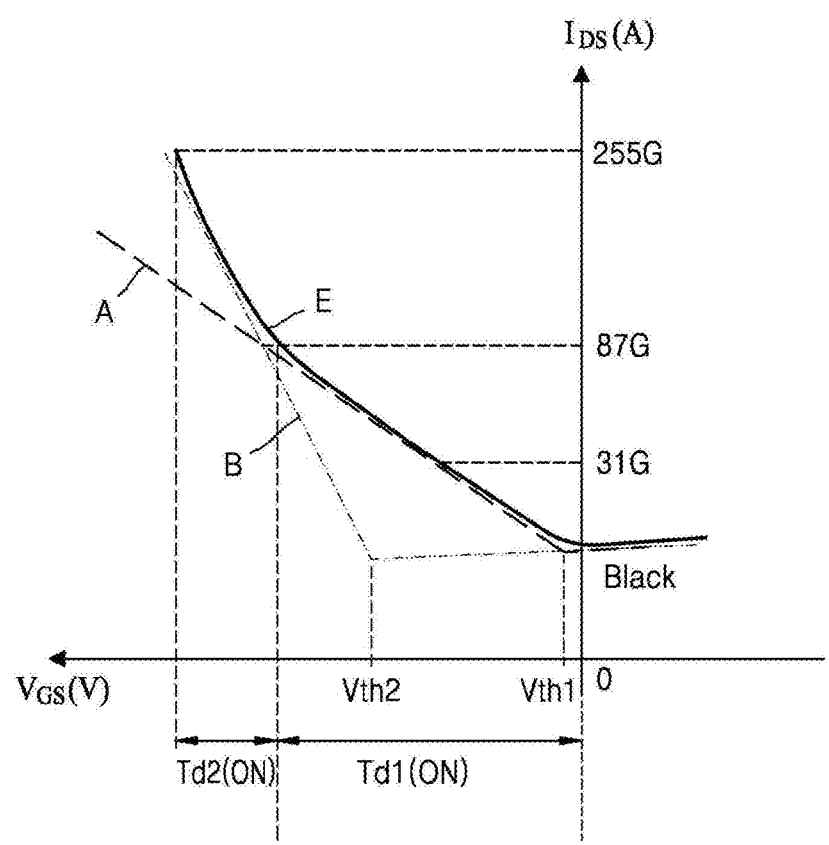

FIGS. 9 to 11 are voltage-current graphs for explaining an operation of an embodiment of a multi-channel TFT as a driving transistor.

The voltage-current graphs of FIGS. 9 and 10 are graphs when the multi-channel TFT T of FIGS. 2A to 5C is embodied as a driving transistor.

In FIGS. 9 and 10, a first graph A is a graph when the first sub-transistor T1 doped at a third doping concentration operates as a single-channel driving transistor. In this case, a driving range of the driving transistor is great.

In FIGS. 9 and 10, a second graph B is a graph when the second sub-transistor T2 doped at third concentration operates as a single-channel driving transistor. In this case, a driving range of the driving transistor is small.

In FIGS. 9 and 10, a third graph E is a graph when the first sub-transistor T1 and the second sub-transistor T2 are connected to each other in parallel, the first sub-transistor T1 operates as the first driving transistor Td1 that is doped at first doping concentration and has a first threshold voltage Vth1, and the second sub-transistor T2 operates as the second driving transistor Td2 that is doped at second doping concentration and has a second threshold voltage Vth2. In this case, in a low gray level area (e.g., a gray level between 0 (black) and 87), only the first driving transistor Td1 is turned on and operates, and in a high gray level area (e.g., a gray level between 87 and 255), the second driving transistor Td2 is also turned on, and thus both the first driving transistor Td1 and the second driving transistor Td2 operate. Therefore, a gray level is expressed within the large driving range in the low gray level area, and the driving range for expressing the entire gray level may be maintained identically to the second graph B.

The voltage-current graph of FIG. 11 is directed to a case where the multi-channel TFT T of FIGS. 6A and 6B is embodied as a driving transistor.

In FIG. 11, a first graph A is a graph when the first sub-transistor T1 operates as a single-channel. In this case, the driving transistor has the first threshold voltage Vth1 and the great driving range.

In FIG. 11, a second graph B is a graph when the second sub-transistor T2 operates as a single-channel. In this case, the driving transistor has the second threshold voltage Vth2 and the small driving range.

In FIG. 11, a third graph E is a graph when the first sub-transistor T1 and the second sub-transistor T2 are connected to each other in parallel, the first sub-transistor T1 operates as the first driving transistor Td1 having the first threshold voltage Vth1, and the second sub-transistor T2 operates as the second driving transistor Td2 having the second threshold voltage Vth2. In this case, in the low gray level area (e.g., a gray level of between 0 (black) and 87), only the first driving transistor Td1 is turned on and operates, and in the high gray level area (e.g., a gray level of between 87 and 255), only the second driving transistor Td2 is turned on and operates. Therefore, a gray level is expressed within the great driving range in the low gray level area, and the driving range for expressing the entire gray level may be maintained identically to the second graph B.

According to embodiments, a gate electrode of a TFT may be under a semiconductor. However, the disclosure is not limited thereto. In an alternative embodiment, the gate electrode may be above the semiconductor. According to embodiments, a source electrode and a drain electrode of the TFT are connected to the semiconductor through contact holes, but the disclosure is not limited thereto. In an alternative embodiment, the source electrode and the drain electrode may be directly connected to the semiconductor or connected to the semiconductor with a conductive layer therebetween. In another alternative embodiment, separate source and drain electrodes are not provided, and a source area and a drain area may function as a source electrode and a drain electrode, respectively.

According to embodiments, as described above, a TFT has a P-type structure, but the disclosure is not limited thereto. Alternatively, the TFT may have an N-type structure.

According to embodiments of the invention, a multi-channel TFT, in which TFTs having different characteristics (driving ranges and threshold voltages) are connected to each other in parallel, is applied to a driving transistor. Thus, in a low gray level, a driving range may be secured by using a transistor operating within a large driving range, and stains may be corrected, and in a high gray level, a margin of a driving range for expressing the entire gray level may be secured by using a transistor operating within a small driving range.

According to embodiments of the invention, characteristics of the multi-channel TFT may be adjusted based on various parameters (doping concentration, a channel size, a thickness of a gate insulating layer, etc.).

According to embodiments of the invention, a semiconductor device including the multi-channel TFT may have improved driving performance, and a display device having high display quality may be provided using the semiconductor device including the multi-channel TFT.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A multi-channel thin film transistor comprising:
a gate electrode;
a semiconductor comprising:
    a first channel area, which operates within a first driving range and has a first threshold voltage; and
    a second channel area which operates within a second driving range smaller than the first driving range and has a second threshold voltage, wherein an absolute value of the second threshold voltage is greater than an absolute value of the first threshold voltage;
a first electrode connected to an end of the semiconductor; and
a second electrode connected to another end of the semiconductor,
wherein a ratio of a channel width of the second channel area to a channel length of the second channel area is greater than a ratio of a channel width of the first channel area to a channel length of the first channel area.

2. The multi-channel thin film transistor of claim 1, wherein an overlapping area of the first channel area and the gate electrode is greater than an overlapping area of the second channel area and the gate electrode.

3. The multi-channel thin film transistor of claim 2, wherein the channel length of the first channel area is greater than the channel length of the second channel area.

4. The multi-channel thin film transistor of claim 2, wherein an area of a first area of the gate electrode, which corresponds to the first channel area, is greater than an area of a second area of the gate electrode, which corresponds to the second channel area.

5. The multi-channel thin film transistor of claim 2, wherein the semiconductor comprises:
a first semiconductor comprising the first channel area; and
a second semiconductor comprising the second channel area.

6. The multi-channel thin film transistor of claim 5, wherein a length of a first area of the first semiconductor, which corresponds to the first channel area, is greater than a length of a second area of the second semiconductor, which corresponds to the second channel area.

7. The multi-channel thin film transistor of claim 1, wherein an overlapping area of the second channel area and the gate electrode is greater than an overlapping area of the first channel area and the gate electrode.

8. The multi-channel thin film transistor of claim 7, wherein the channel width of the second channel area is greater than the channel width of the first channel area.

9. A pixel of a display device, the pixel comprising:
a first transistor connected to a scanning line and a data line of the display device;
a capacitor connected between the first transistor and a power voltage line of the display device;
a second transistor connected between the power voltage line and a node, to which the first transistor and the capacitor are connected; and
an emission device connected to the second transistor,
wherein the second transistor comprises:
a first sub-transistor which operates within a first driving range and having a first threshold voltage; and
a second sub-transistor which operates within a second driving range smaller than the first driving range and having a second threshold voltage,
the first sub-transistor and the second sub-transistor are connected to each other in parallel, and
an absolute value of the second threshold voltage is greater than an absolute value of the first threshold voltage,
wherein a ratio of a channel width of the second sub-transistor to a channel length of the second sub-transistor is greater than a ratio of a channel width of the first sub-transistor to a channel length of the first sub-transistor.

10. The pixel of claim 9, wherein
the channel length of the first sub-transistor is greater than the channel length of the second sub-transistor, or
the channel width of the second sub-transistor is greater than the channel width of the first sub-transistor.

11. The pixel of claim 9, wherein
the first sub-transistor and the second sub-transistor share a gate electrode,
the gate electrode comprises:
    a first area corresponding to a channel area of the first sub-transistor; and
    a second area corresponding to a channel area of the second sub-transistor,
    wherein an area of the first area is greater than an area of the second area.

12. The pixel of claim 9, wherein a length of a semiconductor of the first sub-transistor is greater than a length of a semiconductor of the second sub-transistor.

13. A pixel of a display device, the pixel comprising:
a first transistor connected to a scanning line and a data line of the display device;
a capacitor connected between the first transistor and a power voltage line of the display device;
a second transistor connected between the power voltage line and a node, to which the first transistor and the capacitor are connected; and
an emission device connected to the second transistor,
wherein the second transistor comprises:
a first sub-transistor which operates within a first driving range and having a first threshold voltage; and a second sub-transistor which operates within a second driving range smaller than the first driving range and having a second threshold voltage, the first sub-transistor and the second sub-transistor are connected to each other in parallel, and an absolute value of the second threshold voltage is greater than an absolute value of the first threshold voltage, wherein each of the first sub-transistor and the second sub-transistor comprises a gate electrodes to which a voltage is applied, a thickness of a gate insulating layer of the first sub-transistor is greater than a thickness of a gate insulating layer of the second sub-transistor, the voltage is applied to the gate electrode of the first sub-transistor when the pixel displays a gray level in a first gray level area, and the voltage is applied to the gate electrode of the second sub-transistor when the pixel displays a gray level in a second gray level area greater than the first gray level area.

* * * * *